US009773529B1

(12) United States Patent
Danon et al.

(10) Patent No.: US 9,773,529 B1
(45) Date of Patent: Sep. 26, 2017

(54) METHODS AND DEVICES FOR READING DATA FROM NON-VOLATILE MEMORY CELLS

(71) Applicant: Cypress Semiconductor Corporation, San Jose, CA (US)

(72) Inventors: Kobi Danon, Tel-Aviv (IL); Yoram Betser, Mazkeret Batya (IL); Alex Kushnarenko, Haifa (IL)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/279,974

(22) Filed: Sep. 29, 2016

Related U.S. Application Data

(60) Provisional application No. 62/351,183, filed on Jun. 16, 2016.

(51) Int. Cl.
   *G11C 16/26*   (2006.01)
   *G11C 7/06*    (2006.01)

(52) U.S. Cl.
   CPC .................. *G11C 7/062* (2013.01)

(58) Field of Classification Search
   CPC ........................................ G11C 16/26
   USPC .......................................... 365/236
   See application file for complete search history.

(56) References Cited

U.S. PATENT DOCUMENTS

| 5,619,449 | A |   | 4/1997  | McIntyre |
|---|---|---|---|---|
| 6,069,830 | A | * | 5/2000  | Seo ..................... G11C 11/5621 365/185.21 |
| 7,113,427 | B1 |   | 9/2006  | Mirgorodski et al. |
| 7,313,649 | B2 |   | 12/2007 | Tomita et al. |
| 7,545,180 | B2 |   | 6/2009  | Goel et al. |
| 8,385,123 | B2 |   | 2/2013  | Jones |
| 8,514,633 | B2 |   | 8/2013  | Jeong |
| 8,861,271 | B1 |   | 10/2014 | Zain et al. |
| 9,007,822 | B2 |   | 4/2015  | Hendrickson |
| 9,047,980 | B2 |   | 6/2015  | Agarwal et al. |
| 9,123,419 | B2 |   | 9/2015  | Ogura et al. |
| 2005/0190603 | A1 | * | 9/2005 | Lee ..................... G11C 11/5628 365/185.22 |
| 2009/0073762 | A1 | * | 3/2009 | Lee ..................... G06F 11/1072 365/185.03 |
| 2010/0232229 | A1 | * | 9/2010 | Ogawa .................. G11C 16/06 365/185.21 |
| 2014/0112080 | A1 | * | 4/2014 | Carissimi ................ G11C 7/06 365/189.07 |

(Continued)

OTHER PUBLICATIONS

ResearchGate, "A Multilevel Read and Verifying Scheme for Bi-NAND Flash Memories", IEEE Journal of Solid-State Circuits, Jun. 2007; 10 pages.

(Continued)

*Primary Examiner* — Min Huang

(57) ABSTRACT

A method for operating a read command of N complementary memory cells, the method includes the steps of determining if each of the first and second memory cells of the N complementary memory cells is in a first binary state or a second binary state, generating a count value by counting a total number of the first and second memory cells that are in the first binary state, and determining if the N complementary memory cells are programmed or erased based on a result of comparing the count value to a threshold number.

17 Claims, 5 Drawing Sheets

(56) References Cited

U.S. PATENT DOCUMENTS

| | | | |
|---|---|---|---|
| 2015/0049548 A1* | 2/2015 | Park | G11C 16/26 365/185.11 |
| 2016/0064046 A1* | 3/2016 | Carissimi | G11C 7/06 365/189.15 |
| 2016/0189801 A1* | 6/2016 | Yamaguchi | G11C 29/021 365/200 |

OTHER PUBLICATIONS

International Search Report for International Application No. PCT/US17/19137 dated May 11, 2017; 2 pages.
Written Opinion of the International Searching Authority for International Application No. PCT/US17/19137 dated May 11, 2017; 6 pages.

* cited by examiner

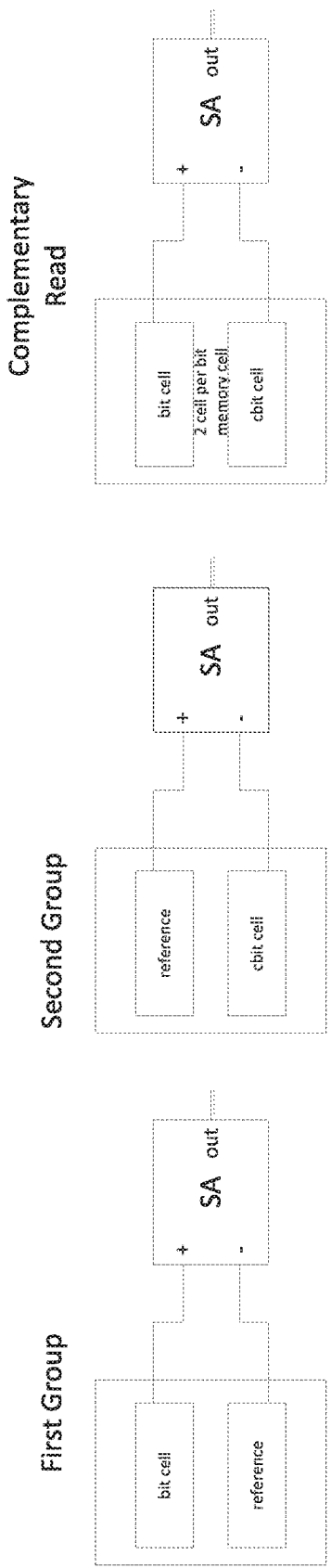

METHODS AND DEVICES FOR READING DATA FROM NON-VOLATILE MEMORY CELLS

CROSS-REFERENCE TO RELATED APPLICATIONS

The present application claims the priority and benefit of U.S. Provisional Application No. 62/351,183, filed on Jun. 16, 2016, which is incorporated by reference herein in its entirety.

FIELD OF THE INVENTION

The present invention relates generally to the field of Non-Volatile Memory (NVM) devices. More specifically, the present invention relates to methods, circuits, devices, and systems for reading data from NVM cells.

BACKGROUND

Integrated circuits (IC) may be used in a wide range of designs and products, some integrated circuits may include Non-Volatile Memory (NVM) arrays. An NVM array may be composed of NVM cells, ancillary circuitry, a controller and additional circuits. The ancillary circuitry may include for example: array controls, address decoding circuits and sense amplifiers (SA) and/or comparators. SAs may be configured to determine a value/level of one or more targeted NVM cell.

Some memory array types may include NVM arrays, floating gate arrays, array of eCT cells, array of MirrorBit cells, charge trapping cells and more.

The NVM cells may be single bit or multi-level storage cells, and the cells may be programmable to different states. For example, in a single bit configuration the cell may be programmable to either an erased (ERS) or programmed (PRG) state.

According to some embodiments, the NVM cells may be accessed internally in the IC through wordlines (WLs), bitlines (BLs), select lines (SLs), memory gates (MGs) or otherwise. For each sequence (Programming of cells, Erasing of cells, Reading of cells etc.), the WLs, BLs, SLs, and/or MGs may be activated accordingly. Operating mode, such as read algorithm, program algorithm, erase algorithm, may determine voltage or current signals applied to WLs, SLs, SGs, MGs of NVM cells. Other factors include the selected addresses, the specific technology being used. In some embodiments, the NVM arrays may include different structural features and may not include select gates (SGs), BLs, SLs, MGs and/or WLs, or otherwise.

Some transistor types which may be used in associated circuitry are Pmos, Nmos, low voltage (LV) Nmos, LV Pmos, high voltage (HV) Nmos and HV Pmos, Zmos which is a low resistance Nmos or Pmos transistor, bipolar junction transistor (BJT), and more. HV transistors/cells may be differentiated from LV transistors/cells by being designed/configured to enable operation in a higher range of voltages across their channel compared to LV cells (for example, between a drain node and a source node of the transistor) and/or across the gate (for example: between their gate and bulk or ground node), and may include a thick oxide region compared to LV devices.

Externally, a host device may including an IC and/or a memory array which may be accessed by a user/host device by sending a user/host device command to carry out a User Read operation, User Program operation, User Erase Operation or otherwise and may include an address that is requested to have the operation applied to. In response to the user Read command, information from the memory device may be output to the user/host device. In response to a User Program command, information may be stored in the memory device. In response to a User Erase command, a segment of the memory may be erased.

SUMMARY OF THE INVENTION

The present invention may include methods, circuits, devices and systems for storing and reading data from non-volatile memory (NVM) cells.

According to some embodiments, a method for responding to a single user read command of a complementary cell array including one or more complementary cell pairs may include: determining if a first group of cells out of a data word is in an erased state or in a programmed state, and outputting a data word so that (a) if the first group of cells is determined to be erased a predetermined binary state (such as "one" or "zero") is output for each bit of the data word and (b) if the first group of cells is determined to be programmed the result of a complementary read is output for each bit of the data word.

According to some embodiments, determining if a first group of cells is in an erased state or in a programmed state may further include counting how many of the first group of cells are in a first binary state to produce a count value and comparing the count value to a predetermined threshold. The predetermined threshold may be programmable and may be updated based on at least one of the following parameters: charge loss, length of life, array cycle count, beginning of life and end of life and more.

According to some embodiments the method comparing a count value to the predetermined threshold may result in/produce a state result. If a first binary state is '0' then the state result may be (a) an erased state if the count value is below the predetermined threshold and (b) the state result may be a programmed state if the count value is above or equal to the predetermined threshold. Or, if the first binary state is '1' then the state result may be (a) an erased state if the count value is above the predetermined threshold and (b) the state result may be a programmed state if the count value is below or equal to the predetermined threshold.

According to some embodiments, counting may be stopped if the count value exceeds the predetermined threshold. Furthermore, determining if a first group of cells is in an erased state or in a programmed state may include a first read event to determine a value of each of a sub-group of target cells out of the first group of cells. Optionally, determining if a first group of cells is in an erased state or in a programmed state further includes a second read event to determine a value of each of a sub-group of twin cells out of the first group of cells. The first and second read events may be carried out simultaneously or serially.

According to some embodiments, an NVM device may include: (a) an NVM array including one or more complementary cell groups each group including at least one pair of cells including a target and twin cell that when in a programmed state the target and twin cells are in opposing binary states, (b) a first plurality of sense amplifiers to detect a state of a first plurality of cells and to output an appropriate binary value, (c) a counter to produce a sum of the binary values received from the sense amplifiers, (d) a controller to determine if a data word is in an erased or programmed state, and (e) a state-dependent switch to output a data word so that if the word is determined to be erased a predetermined binary value ("one" or "zero") is output for each bit of the data word (the same binary value is output for all of the bits) and if the word is determined to be programmed the result of a complementary read is output for each bit of the data word.

According to some embodiments, an NVM device may include logic circuitry to compare a count value to a predetermined threshold and produce a state result.

According to some embodiments, the controller may be configured to determine if the data word is in an erased or programmed state based on the state result. Accordingly, if a first binary state is '0', and if the count value is below the predetermined threshold an erased state is determined. The word may be determined to be in a programmed state if the count value is above or equal to the predetermined threshold.

According to some embodiments, a first plurality of cells may be received from a plurality of target cells and each of a first plurality of sense amplifiers may be configured to compare a target cell and a reference signal and to relay to the counter the binary state of the target cell.

According to some embodiments, a first plurality of cells may be received from a plurality of twin cells and each of the first plurality of sense amplifiers may compare a twin cell and a reference signal and accordingly relay to the counter the binary state of the twin cell. Optionally, the first plurality of sense amplifiers may each receive a twin cell and a target cell and determine the binary value of the target cell.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIGS. 4A-4C depict different SA connectivity for different processes of the same user read command.

Figure 1:
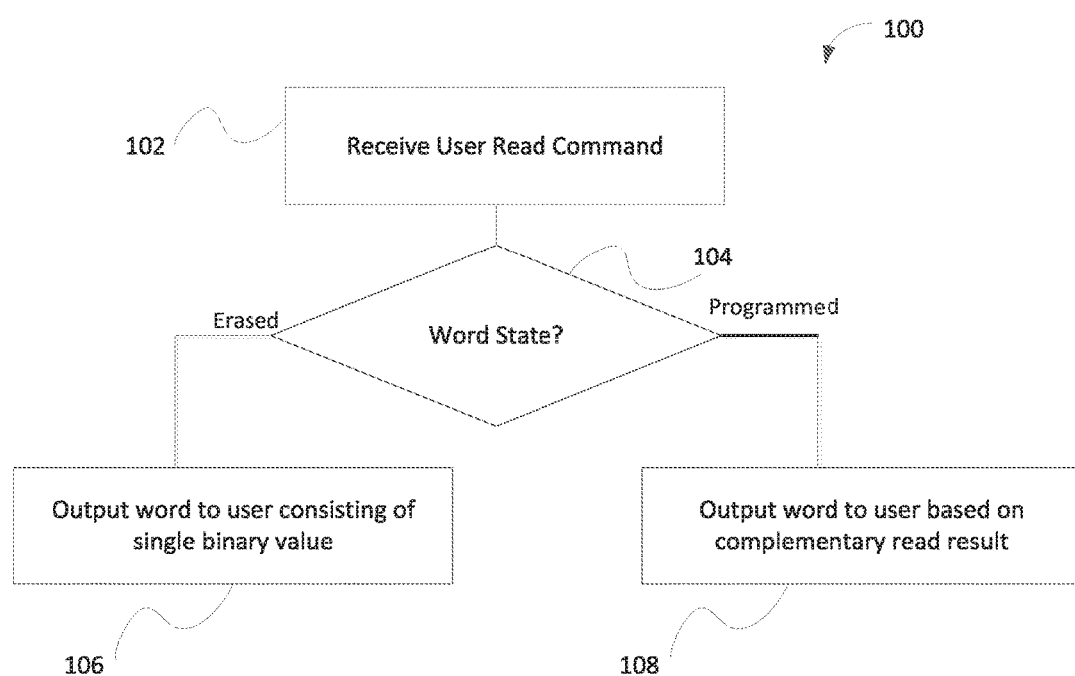
FIG. 1, shown is a flow chart for a method for implementing a single read access according to one embodiment of the subject matter.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing", "computing", "calculating", "determining", or the like, refer to the action and/or processes of circuits, storage, transmission or display devices that manipulate and/or transform data represented as physical, such as electronic, quantities within the circuits into other data or other such information.

Embodiments of the present invention may include apparatuses for performing the operations herein. This apparatus may be specially constructed for the desired purposes. The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below.

NVM array programming circuits, integral or otherwise functionally associated with an NVM array may include a complementary pair including a target and twin cell which may be marked as bit or true bit and complementary bit or cbit, respectively. A complementary pair of NVM cells may store one bit of data on two separate but complementary NVM cells, as inverse or opposite NVM cell charge states on each of the two complementary NVM cells. Similarly, multiple complementary cells are also understood, so that one bit of data may be stored on 4, 6, 8 or more cells. Multiple complementary cells may be implemented by several methods, including but not limited to, averaging the cells' signals per each complementary value by using a majority decision or otherwise. Increasing the number of cells per bit may improve reliability while increasing die size or decreasing the total amount of data that may be stored in the memory. For clarity, in this application, a pair of cells per one data bit will be discussed. However, changing specific embodiments to accommodate multiple pairs of complementary memory cells per bit would be understood by those skilled in the art.

According to some embodiments, a data bit from a pair of complementary NVM cells may be detected using a complementary read sequence using differential sensing. According to the complementary read sequence, current from one NVM cell (such as the twin cell) of the NVM cell pair may be used as a reference current when reading a current level from the other NVM cell (such as the target cell) of the NVM cell pair. Additional complementary sensing methods are understood, such as comparing voltages of a target cell to a twin cell or otherwise. During an Erase sequence, the NVM array cell formatting circuits, integral or otherwise functionally associated with the NVM array, may erase or discharge each of the NVM cells of a complementary NVM cell pair. Optionally, it may perform erase or discharge operations on entire sectors or blocks of NVM cells at the same time. Accordingly, an erase sequence may cause all of the memory cells (targets and twins) to be erased, accordingly for a cell pair both target and twin cell will be in the same (erased) state.

Accordingly, if a user read command is received on an erased sector, in prior art solutions, this may result in corrupt information. If a complementary read is carried out, two erased cells (target and twin) may be compared to each other. Since there may be some variation in voltage or current between them, the bit may be detected as having a programmed state despite the whole sector being erased. In some embodiments, it may involve receiving a user read access and then the user is required to check if the information is corrupt, or not. It may also require the user to monitor or know if a requested sector is erased, and if a read command is received for an erased sector corrupt information will be provided. Accordingly, there is a need for a method for implementing a simple single-read access that outputs correct (non-corrupted) data regardless if the word or NVM array is erased or programmed.

Turning to FIG. 1, shown is a flow chart of a method for implementing a single read access 100. A memory device may receive a user read command (102) from a user (or user device) and may then determine if the requested word is erased or programmed (step 104). If the word is determined to be erased, a word consisting of bit(s) of a single binary value (all '1's or all '0"s) may be output to a user (step 106). If a word is determined to be programmed, the result of a complementary read or differential sensing may be output to the user (step 108). Accordingly, it is ensured that non-corrupt information is supplied to a user in response to a single user-read access/request. Furthermore, typically a "1" is utilized to indicate an erased state. However this is arbitrary, and if selected during design, a "0" may be utilized to indicate an erased bit.

While method 100 has been described by way of example for a word, it is understood that each of the steps 104-108 may be carried out on a word or sector which may include a group of words or otherwise, depending on the array architecture and other considerations.

Figure 2:
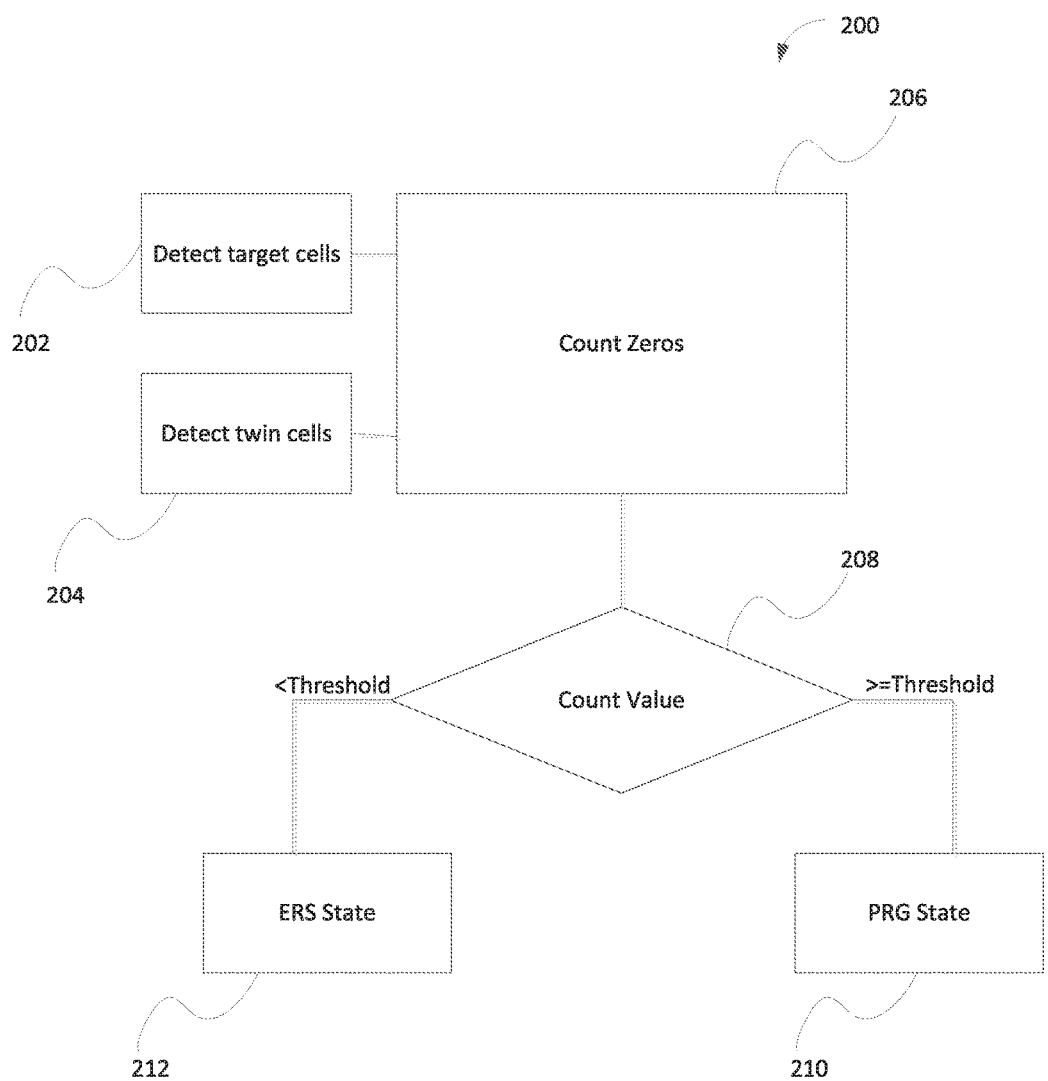
FIG. 2, shown is a flow chart for a method for determining if a word is programmed or erased.

Turning to FIG. 2, a flow chart for a method 200 for determining if a word is programmed or erased is shown. It is understood that method 200 is substantially similar to step 104 of FIG. 1. According to some embodiments, a first group of target cells that store bit may be detected (step 202) as well as a second group of twin cells that store cbit (step 204). A reference read sequence may be utilized for detecting the first and second groups of memory cells. The reference read sequence may include comparing the cell value to a reference cell value, a static reference cell, dynamic reference cell, current or voltage reference, a combination of these and more, and providing a binary value for the charge stored on the cell (typically '1' for an erased cell and '0' for a programmed cell).

According to some embodiments, an N bit data word (referred to herein as a word) may consist of 2N data cells (N cell and N complementary cells). The first group of target cells and second group of twin cells may each be N or less and may be equal or different in size. Furthermore, detection of the target and twin cells may be carried out in parallel, serially, or interleaved depending on the amount of sense amplifier/comparator, power considerations and more.

According to some embodiments, detecting a cell may include attributing a binary state to the cell based on a detected signal from the cell. Typically, as is customary in the art, an erased cell may be considered as having a binary value of '1', and a programmed cell may be considered as have a binary value of '0'. These are only conventions, and of course it is possible to attribute oppositely.

According to some embodiments, the binary values of the first and second groups of cells may be counted, this may also be termed "zero counting". In one embodiment, the number of programmed bits may be detected/counted/summed resulting in a count value (step 206). It is understood that essentially what is being counted is the amount of bits having a first predetermined binary state, and which state that is (erased or programmed) is dependent on the convention selected (erase is "1" or "0" etc.).

According to some embodiments, a count value may be compared to a predetermined state-parameter threshold (step 208), resulting in a state result. According to some embodiments, if the total number of programmed cells ("0") is equal to or exceeds the state-parameter threshold, the word may be determined to be in a "programmed" state (step 210). Otherwise, the state of the word may be determined to be in an "erased" state (step 212). However, since the determination is arbitrary (that a programmed cell is '0' and an erased cell is '1'), it is clear to those skilled in the art that other configurations are applicable (so that if the number of programmed cells is below the state-parameter threshold the word may be determined to be programmed).

According to some embodiments, a word programmed state indicates that the word has been through a program sequence and accordingly, the complementary bits are in a complementing state, i.e. each pair of cells are in opposite binary states (if a target cell is in a programmed state the twin cell is in an erased state, and vice versa). A word erased state indicates that the word has gone through an erase sequence. In a word erased state, all of the cells are in an erased state so that complementary bits are not in a complementing state. i.e. each pair of cells is in the same binary state (typically '1').

It is understood, that single or even multiple failures of detection of the target and/or twin cells compared to a reference would not impact the method's validity or result because of the large difference between the number of expected 0's for an erased state (none) compared to a programmed state (half of the total amount of cells, target and twin). This very large window allows a high reliability operation of the system utilizing the method described herein.

According to some embodiments, the level of the programmable predefined threshold may be updated/optimized to accommodate charge loss or other non-ideal effects, so that the method would remain operable for both beginning of life and end of life operation.

Accordingly, the predetermined threshold may be a function of the number or a total count of expected binary value (for example 0's) for a programmed word. If all of the target and all of the twin cells are being detected, for a word of length N bits, there are 2N cells. In one embodiment, N cells would be detected as having a binary value of '0' (in this example) for a programmed cell (since either the target or the twin would be '0' in a programmed complementary cell). Accordingly, a threshold of N/2 or N/3 or even N/4 or less may be operable. Furthermore, it is understood that the cells may be detected or read until the threshold is exceeded. Then, detection and/or analysis may be stopped (depending on array architecture and design).

According to some embodiments, the predetermined state parameter threshold may be programmable. It may also be updated based on, for example, at least one of the following parameters: charge loss, length of life, array cycle count, beginning of life and end of life. Charge loss may include retention loss of charge over time or over a device being cycled (i.e. other sections/words being erased and programmed). Length of life may also be a parameter relevant to physical characteristics of the NVM cells and charge stored thereon. Array cycle count is the amount of cycles, or expected cycles applied to the array. Beginning of life and end of life are well known terms in the art relating to different typical behaviors of NVM cells at different stages of a device cycle (first time a cell is being programmed vs. after a great number of program and erase cycles).

Figure 3A:
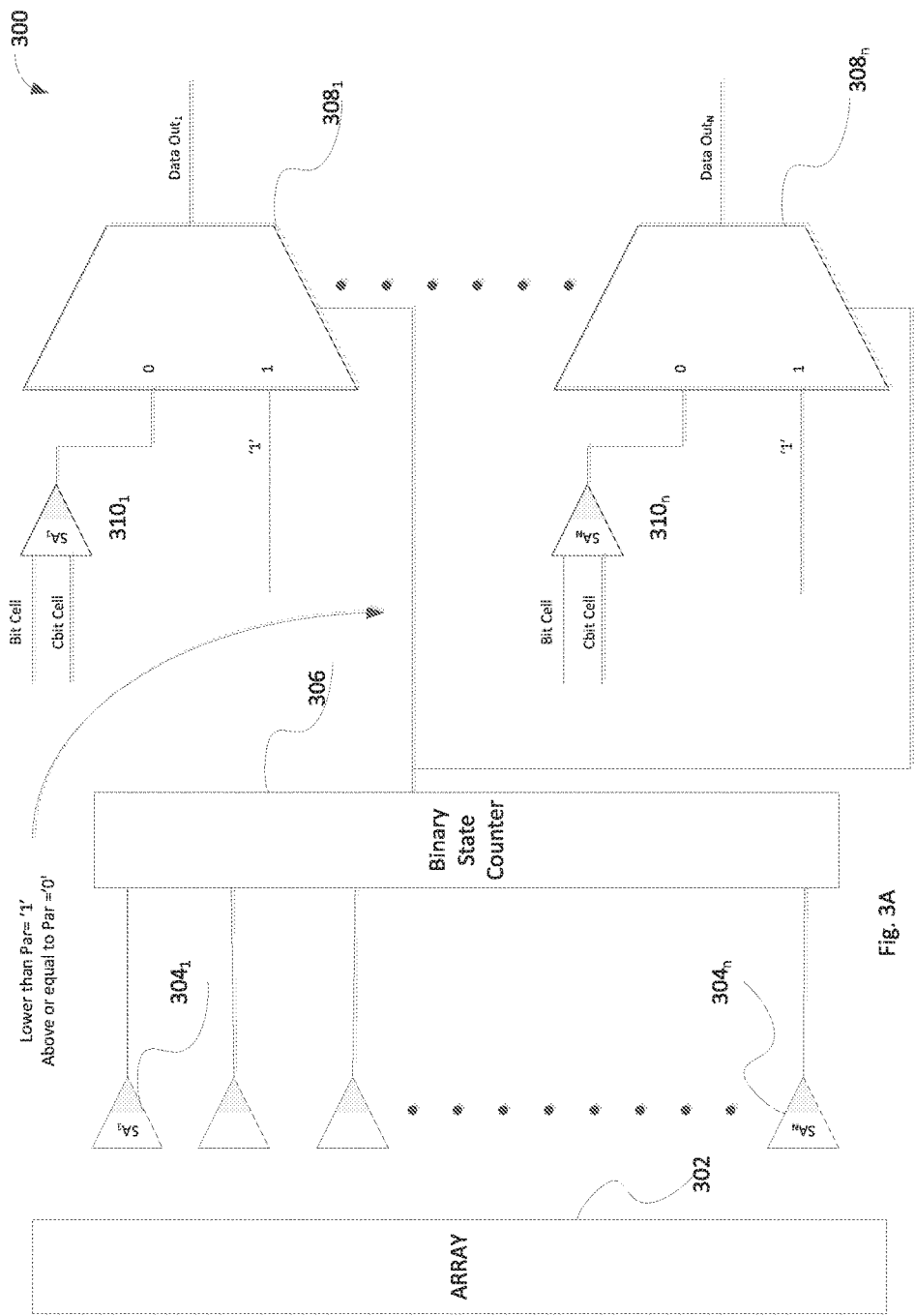
FIG. 3A depicts an example block diagram of an NVM device including an NVM array.

Turning to FIG. 3A, depicted is an example block diagram of an NVM device 300. NVM device 300 includes a memory array such as array 302 for storing information/data. Adjacent or included within array 302, and functionally associated with array 302, is a plurality of comparators or sense amplifiers such as $SA_1$-$SA_n$ ($304_1$-$304_n$ appropriately). Array 302 may include a plurality of NVM cells and peripheral circuitry as described in this application and known in the art. Furthermore, the NVM cells of array 302 may be in a complementary configuration so that each target cell has a twin cell and at least two cells are assigned per bit (true bit and complementary bit). SAs $304_1$-$304_n$ may be configured to receive two signals, compare between them and output a binary value based on the comparison between the two signals. In one embodiment, the two signals may be bit from target cell and a reference signal, or cbit from twin cell and a reference signal. SAs $304_1$-$304_n$ may be functionally connected to binary state counter 306 which may count how many of the SAs results are of a specific binary value (may count '0's or '1's), and may output a state indicator indicating if the counted binary values are above or below a predetermined threshold to indicate if the word is in an erased or programmed state. The count value may be utilized as a control signal of a state dependent switch such as $mux_1$-$mux_n$ ($308_1$-$308_n$ appropriately) and cause either a complementary read or differential sensing result to be output to a user (if a programmed state is indicated) or a logical '1' be output to the user (if an erased state is indicated).

It is understood that SAs $310_1$-$310_n$ may be the same SAs as SAs $304_1$-$304_n$, or not, depending on the array architecture and amount of SAs available.

Figure 3B:
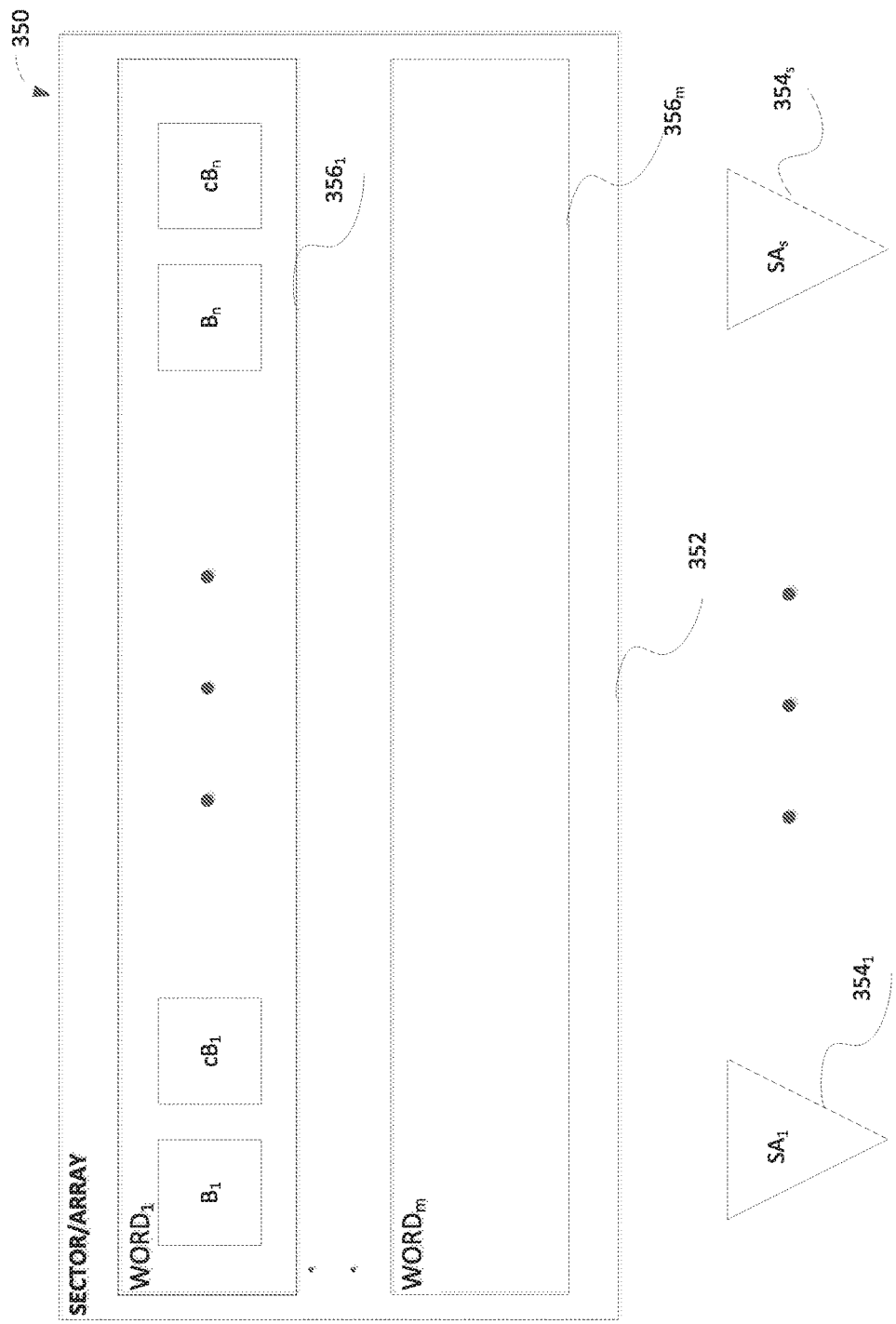
FIG. 3B depicts an example NVM array and associated sense amplifiers (SAs)

Turning to FIG. 3B, depicted is an example array 350 which may include arrays or sector of array 352 and a plurality of SA such as $SA_1$-$SA_s$ (elements $354_1$-$354_s$) and that the amount of SAs may be equal or different than the amount of bits 'n'. It is understood that array 352 and SA $354_1$-$354_n$ are substantially similar to array 302 and SA $304_1$-$304_n$ of FIG. 3A. Array 352 may include a plurality of words such as words $356_1$-$356_m$. Each word may include a plurality of complementary cells, each pair including a target ($B_i$) and a twin ($cB_i$).

Turning to FIGS. 4A-4C depicted are different connectivity for different processes of the same user read command. In FIGS. 4A and 4B connectivity appropriate for a reference read sequence is shown. Accordingly, the target and twin cells which are each being detected separately so that the total number of cells in a specific binary state ('1' or '0') can be counted. Accordingly, in FIG. 4A, a bit cell is compared to a reference and in FIG. 4B a twin cell is compared to a reference. In FIG. 4C the connectivity is appropriate for a complementary read sequence, the SA is connected so that the target cell is compared to its twin cell. In one embodiment, a bit value is produced so that data can be output to a user if a programmed state is detected. It is understood that the SAs of FIGS. 4A-4C may be the same SA (so that a single SA is used to for all three comparisons sequentially) or the SA may be different SAs (so that the comparisons may be carried out at least partially in parallel), or any combination of these two options.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A method for operating a read command of N complementary memory cells, each complementary memory cell including a first and a second memory cells, wherein N is a natural number greater than 0, comprising:
   determining if each of the first memory cells of the N complementary memory cells is in a first binary state or a second binary state;
   determining if each of the second memory cells of the N complementary memory cells is in the first binary state or the second binary state;
   generating a count value by counting a total number of the first and second memory cells that are in the first binary state; and
   determining if the N complementary memory cells are programmed based on a result of comparing the count value to one threshold number, wherein the one threshold number is programmable.

2. The method of claim 1, wherein the first binary state represents data "0" and the second binary state represents data "1".

3. The method of claim 1, wherein the first binary state represents data "1" and the second binary state represents data "0".

4. The method of claim 1, wherein the first memory cells are bit cells and the second memory cells are complementary cells.

5. The method of claim 4, wherein when the N complementary memory cells are determined programmed, further comprising:
   outputting data content of the bit cells as a result of the read command.

6. The method of claim 1, wherein the one threshold number is updated based on at least one of: charge loss, length of life, cycle count, and a state of beginning or end of life of the N complementary memory cells.

7. The method of claim 1, wherein determining if each of the first memory cells is in the first or second binary states includes:
   detecting output of each of the first memory cells;
   comparing, using at least one first sense amplifier, the output of each of the first memory cells to a reference signal.

8. The method of claim 7, wherein determining if each of the second memory cells is in the first or second binary states includes:
   detecting output of each of the second memory cells;
   comparing, using at least one second sense amplifier, the output of each the second memory cells to the reference signal.

9. The method of claim 5, wherein the output of the bit cells of the N complementary memory cells include an N-bit word.

10. The method of claim 8, wherein the reference signal is configured in a range between a first binary state signal and a second binary state signal, and the one threshold number is between 0 and N.

11. A memory device, comprising:
   a plurality of complementary memory cells, each including a bit cell and a complementary cell;
   a plurality of sense amplifiers configured to compare output of the bit cells to a reference signal, and to compare output of the complementary cells to the reference signal;
   a binary state counter, coupled to the plurality of sense amplifiers, configured to generate a count number corresponding to a cumulative number of the bit and complementary cells that include output less than the reference signal, wherein the binary state counter is further configured to generate a state indicator based on a comparison between the count number and a threshold number, wherein the threshold number is programmable; and a plurality of multiplexors, wherein each multiplexor is configured to be coupled to a differential sensing result of one of the plurality of complementary memory cells and an erased binary state signal, each multiplexor is further configured to be coupled to the state indicator as a control signal.

12. The memory device of claim 11, wherein the differential sensing result includes a comparison result of the output of the bit and complementary cells of a same complementary memory cell.

13. The memory device of claim 11, wherein the threshold number is updated based on at least one of the following parameters: charge loss, length of life, array cycle count, and a state of beginning of life or end of life of the plurality of complementary memory cells.

14. A non-transitory computer readable storage medium comprising stored instructions thereon, the instructions when executed cause a processing element to:

execute a read command of N memory cells, wherein N is a natural number greater than 0, and each memory cell includes a bit cell and a complementary cell, the read command further includes,
  a first read event wherein output of each of the bit cells is compared to a reference signal, and
  a second read event wherein output of each of the complementary cells is compared to the reference signal;

generate a cumulative count value corresponding to results of the first and second read events;

compare the cumulative count value to one threshold value to determine if the N memory cells are in a programmed state, wherein the one threshold number is programmable; and output results of differential sensing of each memory cell when the N memory cells are determined in the programmed state.

15. The non-transitory computer readable storage medium of claim 14, wherein the first and second read events are executed separately.

16. The non-transitory computer readable storage medium of claim 14, wherein the first and second read events are executed at least partially concurrently.

17. The non-transitory computer readable storage medium of claim 14, wherein the results of differential sensing of each memory cell of the N memory cells include an N-bit word.

* * * * *